US007729070B2

(12) United States Patent
Feller

(10) Patent No.: US 7,729,070 B2
(45) Date of Patent: *Jun. 1, 2010

(54) METHOD AND APPARATUS FOR INTERPOLATING PEAK DETECTION OF SERVO STRIPE PULSES

(75) Inventor: Marc Feller, Long Beach, CA (US)

(73) Assignee: Certance LLC, Costa Mesa, CA (US)

( * ) Notice: Subject to any disclaimer, the term of this patent is extended or adjusted under 35 U.S.C. 154(b) by 1196 days.

This patent is subject to a terminal disclaimer.

(21) Appl. No.: 11/316,609

(22) Filed: Dec. 21, 2005

(65) Prior Publication Data

US 2006/0132950 A1   Jun. 22, 2006

Related U.S. Application Data

(60) Provisional application No. 60/639,375, filed on Dec. 22, 2004.

(51) Int. Cl.
G11B 5/09 (2006.01)
G11B 5/584 (2006.01)
G11B 20/18 (2006.01)

(52) U.S. Cl. .................................. 360/39; 360/77.12

(58) Field of Classification Search ........................ None
See application file for complete search history.

(56) References Cited

U.S. PATENT DOCUMENTS 4,564,804 A * 1/1986 Wilke et al. ............... 324/103 P
4,658,368 A 4/1987 Blais et al.
4,819,197 A 4/1989 Blais et al.
5,274,569 A * 12/1993 Prasad .......................... 702/66
6,463,450 B1 10/2002 Balachandran et al.
2004/0052314 A1 * 3/2004 Copeland .................... 375/296

FOREIGN PATENT DOCUMENTS

CA    2335188 A1    8/2002
JP    10160507      6/1998

OTHER PUBLICATIONS

Oppenheim et al., "Discrete-Time Signal Processing", Prentice-Hall, 1989, pp. 679-683.
Gardner, "Interpolation in Digital Modems- Part I: Fundamentals", IEEE Transactions on Communications, vol. 41, No. 3, Mar. 1993, pp. 501-507.
Erup et al., "Interpolation in Digital Modems- Part II: Implementation and Performance", IEEE Transactions on Communications, vol. 41, No. 6, Jun. 1993, pp. 998-1008.

* cited by examiner

*Primary Examiner*—Daniell L Negrón
(74) *Attorney, Agent, or Firm*—Baker Botts L.L.P.

(57) ABSTRACT

A method and device for detecting a peak which is substantially the same as the actual peak are disclosed. In one embodiment, the device includes a filter, a shift register, a controller and a digital interpolator. The filter is configured to receive a plurality of signal samples and the shift register, which is coupled with the filter, has multiple registers. The shift register is configured to receive the plurality of signal samples and to shift the plurality of signal samples through the registers. The controller is coupled with the shifter register and is configured to detect a zero-crossing event in the signal samples. The digital interpolator is coupled with the controller and configured to perform a binary search to identify a peak substantially the same as the actual peak.

13 Claims, 4 Drawing Sheets

METHOD AND APPARATUS FOR INTERPOLATING PEAK DETECTION OF SERVO STRIPE PULSES

CROSS-REFERENCE TO RELATED APPLICATIONS

This application claims the priority of an earlier filed U.S. provisional application Ser. No. 60/639,375, filed on Dec. 22, 2004.

FIELD OF THE INVENTION

The present invention relates to mass storage devices. More particularly, the present invention relates to tape drive technology.

BACKGROUND OF THE INVENTION

With increasing popularity of high resolution digital processing devices such as High Definition Television ("HDTV") and high quality imaging processing devices, a fast and accurate mass storage device has been increasingly in demand. Magnetic storage media such as magnetic tape has continued to be an efficient medium for data storage for the high resolution digital processing devices such as computers and HDTV. To enhance data storage and retrieval performance in a tape recording, it is critical to position the transverse head at a right location over the magnetic tape. In digital tape recorders, voltage peaks arising from pre-recorded, slanted magnetic stripes on tape are typically used to determine transverse head position based on peak-to-peak time intervals.

To enhance the head position with respect to the tape, a conventional approach is to use multiple stripes that can be detected by a magnetic head. FIG. 1 shows a conventional technique that includes two stripes 101 and 102. Stripe 101 is configured to slant at a positive angle with respect to the tape 100 and stripe 102 is slanted at a negative angle with respect to the tape 100. Stripes 101 and 102 are separated by a distance down the tape 100. When the head position 103 is near the top of the stripes 101-102, the servo signals or pulses 105 caused by the stripes 101-102 will occur wherein the distance (or time) between the pulses or peaks is $t_1$. When the head position 104 is near the bottom of the stripe pair, the pulses or servo signals 106 will occur wherein the distance (or time) between the pulses is $t_2$. It should be noted that $t_2$ is greater than $t_1$ wherein the difference in distance or time indicates the location of the head position. For example, if the detection of stripes 101-102 is around $t_1$, it indicates the head is at the head position 103, while if the detection of stripes 101-102 is around $t_2$, it indicates the head is at the head position 104.

Given the knowledge of the tape speed, the instantaneous transverse location of the head may be determined by measuring the time interval between the servo stripe pulses detected by the head. The head can then be adjusted to position as desired by measuring a succession of stripe pairs continuously. To make the measurements, the servo signals or pulses 105 or 106 are delivered to a detection logic that reports the time of occurrence of each peak. A problem associated with this conventional approach is that the servo signals or pulses derived from the stripes are difficult to detect. Another problem associated with this approach is that the conventional detection scheme is susceptive to timing error due to noise on the servo signals. Yet another problem is that when a sampled-data system is employed, the accuracy of peak time location is limited by the sampling rate, since the peak of interest may fall between samples at an unknown time.

Accordingly, there is a need in the art to improve the noise immunity and the detection of the servo signals.

SUMMARY OF THE INVENTION

The present invention discloses an interpolating peak detection device that is capable of providing a peak that is substantially the same as the true peak detected from the servo signal pulse. In one embodiment, the device includes a filter, a shift register, a controller and a digital interpolator. The filter is configured to receive signal samples and the shift register, which is coupled with the filter, has multiple registers or a n-byte register array. The shift register is configured to receive multiple signal samples and then passes the multiple signal samples through the plurality of registers. The controller (or control circuit) is coupled with the shifter register and is configured to monitor the center stages of the shift register. In one embodiment, a sign change, which indicates a zero-crossing, is detected when a sign change is detected in the center stages. The digital interpolator, which can also be referred to as an interpolation filter, is coupled with the controller and configured to perform a binary search to identify a peak, which is substantially the same as a true peak.

Additional features and benefits of the present invention will become apparent from the detailed description, figures and claims set forth below.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
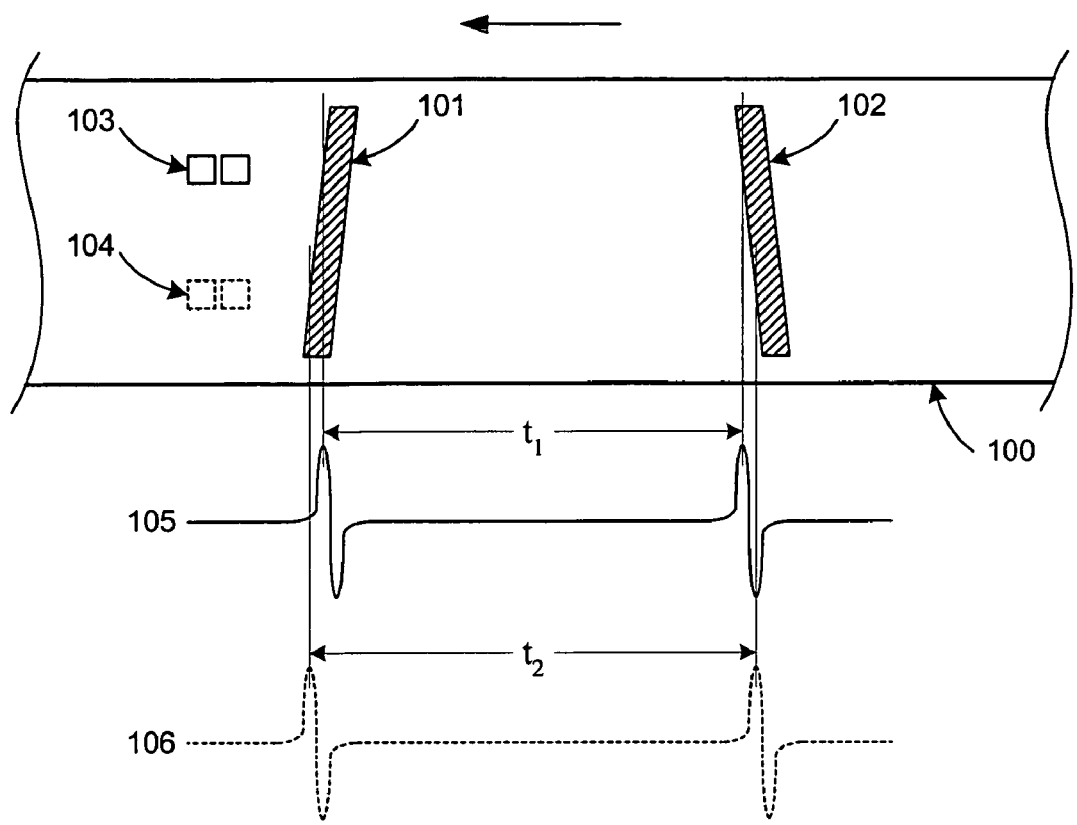
FIG. 1 illustrates a pair of oppositely-slanted magnetic stripes representative of a servo pattern on tape.

A method and apparatus for detecting servo stripe pulses and measure the time between the pulses are discussed.

Those of ordinary skill in the art will realize that the following detailed description of the present invention is illustrative only and is not intended to be in any way limiting. Other embodiments of the present invention will readily suggest themselves to such skilled persons having the benefit of this disclosure. It will be apparent to one skilled in the art that these specific details may not be required to practice to present invention. In other instances, well-known circuits and devices are shown in block diagram form to avoid obscuring the present invention. In the following description of the embodiments, substantially the same parts are denoted by the same reference numerals.

The present invention discloses an interpolating peak detection device that is capable of providing a peak that is substantially the same as the true peak detected from the servo signal pulse. In one embodiment, the device includes a filter, a shift register, a controller and a digital interpolator. The filter is configured to receive a plurality of signal samples and the shift register, which is coupled with the filter, has multiple registers or a n-byte register array. The shift register is configured to receive multiple signal samples and then passes the multiple signal samples through the plurality of registers. The controller is coupled with the shifter register and is configured to monitor the center stages of the shift register. In one embodiment, a sign change, which indicates a zero-crossing, is detected when a sign change is detected in the center stages. The digital interpolator is coupled with the controller and configured to perform a binary search to identify a peak, which is substantially the same as a true peak.

Figure 2:
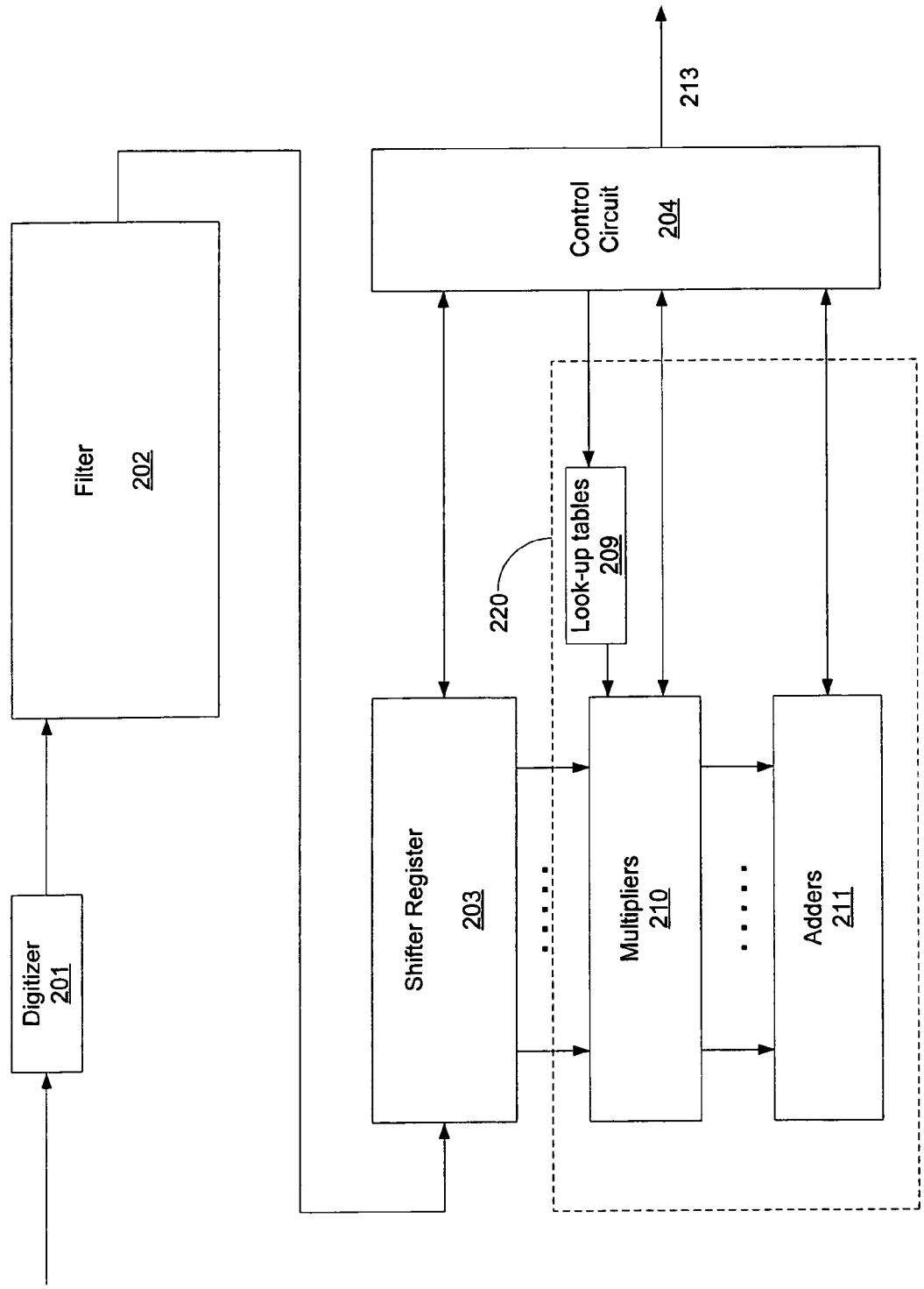
FIG. 2 is a block diagram illustrating an interpolating peak detection device in accordance with one embodiment of the present invention.

FIG. 2 illustrates an interpolating peak detection ("IPD") device in accordance with one embodiment of the present invention. The IPD device includes a digitizer 201, a filter 202, a shifter register 203, an interpolation filter 220 and a control circuit 204. Digitizer 201, in one embodiment, is an analog to digital converter that is used to convert analog servo stripe signals or pulses to digital format before the signals are being transported to filter 202. It should be noted that the terms servo stripe signal and servo stripe pulse will be used interchangeably herein. Filter 202 may be a quadrature filter or a Hilbert filter which is a Finite Impulse Response (FIR) filter having a property of converting sines into cosines and cosines into sines, in this way changing each peak in its input signal into a zero-crossing in its output signal.

A shifter register 203 in one embodiment includes a register array, which may contain 16 stages wherein each stage can store up to 8 bits. The shifter register 203 contains center stages, which are the middle two stages. For example, for a 16-stage shift register, the center stages would be the $8^{th}$ and $9^{th}$ stages. A function of the shifter register 203 is to monitor the sign change in the center stages. If a sign change is detected for example, it indicates that the shifter register 203 contains sufficient properly-aligned samples to reconstruct the peak or zero-crossing event to locate the point of zero-crossing. A zero-crossing event is defined as a signal with a positive value changing to a negative value, or as a signal with a negative value changing to a positive value. The instant of change is the zero-crossing. It should be noted that the shifter register 203 can have any length of stages such as 32, 64, 128, 265, 512, and so forth.

Interpolation filter 220 further includes a plurality of multipliers 210, adders 211, and look-up tables 209. In one embodiment, the interpolation filter 220 is used to perform the binary function to locate a point as close to the point of real zero-crossing as possible. Look-up tables 209 contains various sets of coefficients for different points. Control circuit 204 is configured to provide various commands to control the finding of the peak such as activating the binary search method. For example, control circuit 204 determines when to save the contains in the shifter register 202 and at which timing instant to interpolate the signal samples using the binary search method.

In operation, digitizer 201 operates at a fixed frequency to digitize analog signals detected from the servo stripe pulses and then forwards digitized analog signals to the filter 202, also known as a filtering circuit or a quadrature filter. Filter 202 identifies signal peaks or pulses in the digitized analog signals and converts the signal peaks to zero-crossings. The output of the filter 202, which is, in one embodiment, the signal samples, is then passed to a first array of N registers.

Control circuit 204 monitors the sign change of the center pair of stages (or center stages) of the first register array. In one embodiment, each element (or storage cell) of the first register array is connected to the input of an element in a second array of N registers to save the succession of signal samples when the detection of sign change occurs. Interpolation filter 220 is connected to the output of the second register array capable of calculating the signal value lying in the interval enclosed by the center pair of stages at any of $2^m$ positions, wherein m is an integer number.

The output of the interpolation filter 220 is coupled to a means for detecting the sign of the result. Control circuit (or control engine) 204 selects a sequence of m interpolation instants to program (or to instruct) the interpolation filter 220 wherein the control circuit 204 determines each instant by examining the output of the sign detector in such a way as to converge on the instant closest to the actual zero-crossing location with an accuracy of $\frac{1}{2}^m$. A counter is used to content increment at each sampling instant. An output register is used to maintain the binary representation of the $m^{th}$ instant. A subtractor determines the interval between two successive peaks, and a divider scales the output from the subtractor in accordance with the speed of the tape.

Figure 3:
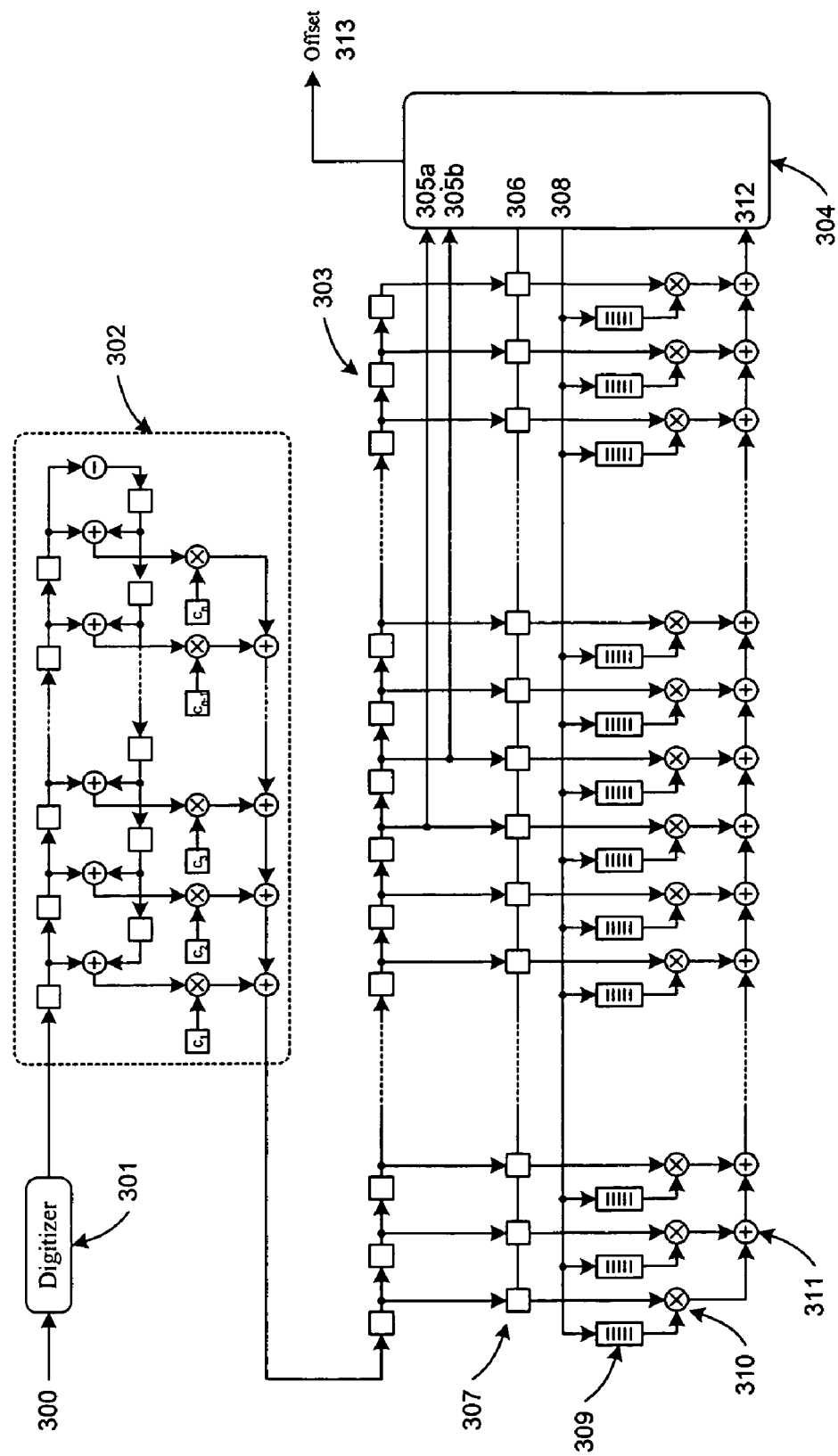
FIG. 3 is a diagram illustrating a layout of interpolating peak detection device in accordance with one embodiment of the present invention.

FIG. 3 illustrates a layout of IPD device in accordance with one embodiment of the present invention. The IPD device includes a digitizer 301, a filter 302, a shifter register 303, a holding register 307, look-up tables 309, multipliers 310, adders 311 and a control circuit or control engine 304. Digitizer 301, in one embodiment, is an analog to digital converter that is used to convert analog servo stripe signals to digital data before the signals are being transported to the filter 202. Filter 202, in one embodiment, is a Finite Impulse Response (FIR) filter that converts peak events to zero-crossing events. A shifter register 303 includes a register array, which may contain 16 stages wherein each stage can store up to 8 bits. Holding register 307 has the same storing capacity as the shifter register 303 so that when a change of sign is detected, the contents in the shifter register 303 is stored in the holding register 307. In another embodiment, shifter register 303 can be one of 32, 64, 128, and 265 stages. Control engine 304 is configured to provide various commands to control the finding of the peak using the binary search method.

The playback servo signal, or servo stripe pulse is applied to a digitizer 301 operating at a fixed sampling rate which produces a succession of signal samples. The signal samples are applied to a filter 302 which has the property of converting sines into cosines and cosines into sines so as to replace each peak with a zero-crossing. Filter 302 is a quadrature filter which differs from conventional calculus-based differentiator in that it does not accentuate high frequencies. In one embodiment, the mathematical description and properties of the quadrature filter can be derived from the Hilbert transform.

After converting from peaks to zero-crossings, the signal samples from the quadrature filter 302 are applied to a shifter register 303 through which they continually pass. Control engine 304 continuously monitors the central two stages of the register via inputs 305a and 305b. When the control engine 304 detects a change in sign between input 305a and input 305b, it determines that a peak occurred between the samples contained in the central two stages, that is, in the time interval extending from when the first sample was taken to when the second was taken. At this point, the control engine 304 issues a capture command 306 which causes the contents of shifter register 303 to be transferred in its entirety to a holding register 307.

An iterative peak-location algorithm now commences, using a programmable filter consisting of lookup tables 309, multipliers 310, and adders 311. The filter performs interpolation of the signal at points between actual data samples according to command signal 308, which selects the appropriate coefficients from the lookup tables to be applied to the multiplier/adder 310/311. Thus, for example, a particular setting of command signal 308 would cause the filter to calculate the value the signal would have had were it sampled at a point midway between the two actual samples 305a and 305b; another setting would cause it to calculate the value the signal would have had at a point one-quarter of the way from 305a to 305b, and so on. Control engine 304, in one embodiment, commands the filter to begin at the midpoint, and the sign of the result is compared to the sign of signal 305a. If these are different, then the peak lies between them, and if the same, then the peak lies between the midpoint and signal 305b. Control engine 304 inspects the sign of the filter output 312 and issues commands such as dividing the interval containing the peak into two equal parts. This process continues iteratively, with the control engine 304 remembering the succession of signs, until the location of the peak has been determined with sufficient accuracy for the application. The control engine 304 then reports the offset of the peak from point 305a, said offset being encoded by the succession of signs.

It should be noted that a point at any fractional location between existing samples may be reconstructed by means of an interpolation filter which is a FIR filter. A different set of filter coefficients is required for each point which it is desired to reconstruct, since it is impractical to reconstruct a large number of samples simultaneously for examination. IPD device uses a binary search method in guiding several successive reconstructions on the same set of data samples that isolates the actual peak with successively finer resolution until the desired resolution is obtained. This process may be performed on a differentiated signal, but it may employ a quadrature filter or "Hilbert Transformer", also a FIR filter but with fixed, predetermined coefficients, since such filter does not accentuate high frequencies.

In another embodiment, the incoming samples are passed through a quadrature filter 302 which replaces the peaks of the original signal with zero-crossing events. The resulting modified samples are shifted into a long register array where they may be inspected. When a change of sample sign is encountered between the two center stages of the register array, those stages are known to enclose a zero-crossing event. The instantaneous array contents are then loaded into the interpolation filter where they will remain stable while interactive location of the zero-crossing (and thus the original peak) is performed. This process successively applies different coefficients to the Interpolation Filter to determine the signs of intermediate points by means of binary search. First the center intermediate point (or one near the center) is reconstructed. If its sign is different from that of the preceding data sample, the zero-crossing is known to lie between that sample and the interpolated point; otherwise it lies between the interpolated point and the following data sample. The center or near-center point of whichever interval it may be is then interpolated. In this way it is successively determined in which half, quarter, eighth, sixteenth, and so on of the sample interval the zero-crossing lies. The process terminates when sufficient resolution has been achieved; the system is the reset and a new set of data shifted into locate the subsequent peak.

Figure 4:
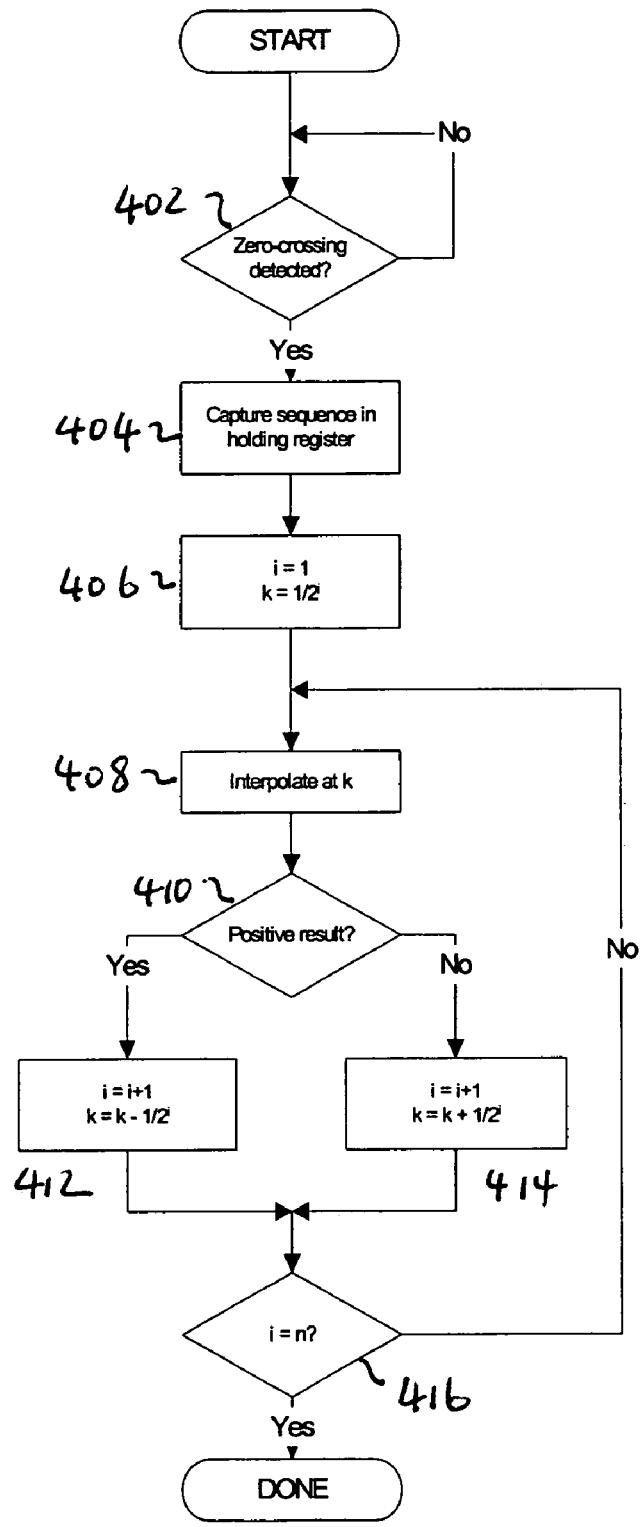
FIG. 4 is a flowchart illustrating a process of finding a peak close to the true peak using binary search technique in accordance with one embodiment of the present invention.

FIG. 4 is a flowchart illustrating a process of finding a peak close to the true peak using binary search technique in accordance with one embodiment of the present invention. At block 402, the process receives information or signal samples and examines whether a zero-crossing is found. In one embodiment, the process checks the sign change only at the center stages of a shifter registers or a register array. If zero-crossing has not been found, the process stays at block 402 to check the incoming new signal samples. If, however, the process detects a zero-crossing, it proceeds to block 404.

At block 404, the process captures the at least a portion of the sequence including the center stages in a holding register. In one embodiment, the process captures the entire contents in the shifter register in which a portion of the signal samples before the center stages as well as a portion of the signal samples after the center stages are saved in a register array. Once the signal samples are captured, the process moves to the next block.

At block 406, the process proceeds to set parameters to implement binary search. The process set i (a counter) to 1 and k equals to $(½)^i$. The process subsequently proceeds to the next block.

At block 408, the process proceeds to interpolate the stored signal samples to identify a point between two numbers stored in the center stages.

At block 410, the process proceeds to check whether the result is positive or not. If the result is positive, the process proceeds to block 412. On the other hand, if the result is negative, the process proceeds to block 414

At block 414, the process proceeds to add 1 to i. Also, k is adjusted by adding $(½)^i$. The process then moves to the next block.

At block 412, the process proceeds to add 1 to i and minus $(½)^i$ from k. The process then moves to the next block.

At block 416, the process checks to see whether i equals to n, where n is, in one embodiment, predetermined by a user. If i equals to n, the process ends. However, if i is not equal to n, then the process loops back to block 408 to continue the process.

While particular embodiments of the present invention have been shown and described, it will be obvious to those skilled in the art that, based upon the teachings herein, changes and modifications may be made without departing from this invention and its broader aspects. Therefore, the appended claims are intended to encompass within their scope all such changes and modifications as are within the true spirit and scope of this invention.

What is claimed is:

1. A device for identifying a peak comprising:
   a filter configured to receive a plurality of signal samples, wherein said filter is a quadrature filter that converts a peak event to a zero-crossing event;
   a shift register, coupled with said filter, comprising a plurality of registers, said shift register configured to receive said plurality of filtered signal samples and to shift said plurality of filtered signal samples through said plurality of registers, wherein said plurality of registers includes center pair registers;
   a controller coupled with said shift register and configured to detect a zero-crossing event in response to said plurality of filtered signal samples, wherein said controller is further configured to save at least a portion of said plurality of said filtered signal samples in response to sign changes between said center pair registers; and
   a binary interpolator coupled with said controller and configured to perform a binary search on said saved filtered signal samples to identify a peak substantially the same as an actual peak.

2. The device of claim 1 further comprising a digitizer coupled to said filter, wherein said digitizer is capable of converting data from analog format to digital format.

3. The device of claim 2, wherein said digitizer is an analog to digital converter that converts analog signals detected over a plurality of stripes on a magnetic type to digital signals.

4. The device of claim 1, wherein said shift register comprises a plurality of 16, 32, 64, 128, 256, or 512 registers.

5. The device of claim 1, wherein said binary interpolator further includes:
   a set of look-up tables containing a plurality of predetermined coefficients; and
   a set of multipliers coupled to said look-up tables to perform a multiply function between saved filtered signal sample data and selected coefficients from said look-up tables.

6. The device of claim 1, wherein said binary interpolator further includes a set of adders that is coupled to said set of multipliers for adding at least two successive results from said multipliers.

7. A method for identifying a peak. comprising:
   receiving a plurality of signal samples in response to detecting of servo stripe Pulse;
   detecting peaks in said plurality of signal samples;
   converting said peaks to zero-crossing events, by applying a quadrature filter;
   identifying sign change between two successive filtered signal samples, by utilizing center pair registers in a plurality of registers in a shift register;
   saving at least a portion of said plurality of filtered signal samples in response to said sign change; and
   performing a binary search on said saved portion of said plurality of filtered signal samples to reconstruct a peak, which is substantially the same as an actual peak.

8. The method of claim 7, further comprising digitizing analog signal samples generated from said stripe pulse to digital signals samples.

9. The method of claim 7, wherein said performing a binary search further includes identifying a set of coefficients from look-up tables in response to number of iterations.

10. The method of claim 9, wherein said performing a binary search further includes multiplying at least one saved filtered sample and a selected coefficient.

11. The method of claim 10, wherein said performing a binary search further includes performing an add function between two outputs from multipliers.

12. An apparatus of identifying a peak, comprising:
   means for receiving a plurality of signal samples in response to detecting of servo stripe pulse;
   means for detecting peaks in said plurality of signal samples;
   means for converting said peaks to zero-crossing event, by applying quadrature filter;
   means for identifying sign change between two successive filtered signal samples, by utilizing center pair registers in a plurality of registers in a shift register;
   means for saving at least a portion of said plurality of filtered signal samples in response to said sign change; and
   means for performing a binary search on said saved portion of said plurality of filtered signal samples to reconstruct a peak, which is substantially the same as an actual peak.

13. The apparatus of claim 12, wherein said means for performing a binary search further includes means for multiplying at least one saved filtered sample and a selected coefficient.

* * * * *